United States Patent
Fang et al.

(10) Patent No.: US 10,340,183 B1
(45) Date of Patent: Jul. 2, 2019

(54) COBALT PLATED VIA INTEGRATION SCHEME

(71) Applicant: GLOBALFOUNDRIES INC., Grand Cayman (KY)

(72) Inventors: Qiang Fang, Ballston Lake, NY (US); Shafaat Ahmed, Ballston Lake, NY (US); Zhiguo Sun, Halfmoon, NY (US); Jiehui Shu, Clifton Park, NY (US); Dinesh R. Koli, Halfmoon, NY (US); Wei-Tsu Tseng, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/860,318

(22) Filed: Jan. 2, 2018

(51) Int. Cl.
*H01L 21/768* (2006.01)
*H01L 23/522* (2006.01)
*H01L 23/532* (2006.01)

(52) U.S. Cl.
CPC .. *H01L 21/76844* (2013.01); *H01L 21/76807* (2013.01); *H01L 21/76877* (2013.01); *H01L 23/5226* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 6,194,315 B1 | 2/2001 | Hu et al. | |
| 9,824,970 B1 * | 11/2017 | Zhang | H01L 23/528 |
| 9,997,457 B2 | 1/2018 | Jezewski et al. | |
| 2003/0071355 A1 | 4/2003 | Dubin et al. | |
| 2006/0188659 A1 | 8/2006 | Chen et al. | |
| 2014/0183738 A1 | 7/2014 | Jezewski et al. | |
| 2016/0163586 A1 * | 6/2016 | Siew | H01L 21/76844 438/653 |
| 2016/0307793 A1 * | 10/2016 | Huang | H01L 21/76879 |
| 2017/0170062 A1 * | 6/2017 | Murray | H01L 21/76879 |

FOREIGN PATENT DOCUMENTS

| | | |
|---|---|---|
| DE | 112013005829 | 9/2015 |
| TW | 201533845 | 9/2015 |
| WO | 2014105477 | 7/2014 |

OTHER PUBLICATIONS

Mont et al., "Cobalt Interconnect on Same Copper Barrier Process Integration at the 7nm node", Technology Research Group, Globalfoundries Inc., 3 pages (Date Unknown).
German Office Action in related DE Application No. 10 2018 206 436.9 dated May 9, 2018, 3 pages.
Taiwanese Office Action and Search Report in related TW application No. 107115760 dated Oct. 31, 2018, 10 pages.

* cited by examiner

*Primary Examiner* — Cory W Eskridge
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to a cobalt plated via integration scheme and methods of manufacture. The structure includes: a via structure composed of cobalt material; and a wiring structure above the via structure. The wiring structure is lined with a barrier liner and the cobalt material and filled with conductive material.

13 Claims, 4 Drawing Sheets

COBALT PLATED VIA INTEGRATION SCHEME

FIELD OF THE INVENTION

The present disclosure relates to semiconductor structures and, more particularly, to a cobalt plated via integration scheme and methods of manufacture.

BACKGROUND

Integrated circuit (IC) devices typically include discrete circuit elements, e.g., transistors, capacitors and resistors, which require interconnect structures to electrically couple or connect the discrete circuit elements into functional circuits. Typical middle of line (MOL) and back end of line (BEOL) metal interconnects may include a wiring line portion and a via portion; however, as technology nodes scale downwards, the interconnect structures become more challenging to fabricate due to the critical dimension (CD) scaling and process capabilities.

By way of example, the interconnect structures are typically fabricated from copper, and may include a barrier layer such as titanium or tantalum or nitride materials such as tantalum nitride or titanium nitride, or a combination thereof. A problem with utilizing copper interconnect structures is that they are highly susceptible to electromigration (EM) which can lead to void formation and failure. One type of EM induced failure is referred to as "line-depletion", which initiates from the Cu/Dielectric cap interface.

Also, as technology advances, problems arise with filling the interconnect structures, themselves. By way of example, conventional deposition of the TaN/Ta liner and Cu fill beyond a 10 nm node technology is challenging because it cannot provide sufficient coverage of the seed Cu and wider top opening before electro-plating. To this end, an issue is that the metal via fill will impact via void, and impact the die yield and device performance.

SUMMARY

In an aspect of the disclosure, a structure comprises: a via structure composed of cobalt material; and a wiring structure above the via structure. The wiring structure is lined with a barrier liner and the cobalt material and filled with conductive material.

In an aspect of the disclosure, a structure comprises: a lower level wiring structure; a via structure in electrical contact with the lower level wiring structure, the via structure including cobalt fill material; and an upper level wiring structure in electrical contact with the via structure, the wiring level wiring structure lined with at least the cobalt material and filled with conductive material.

In an aspect of the disclosure, a method comprises: forming a lower level wiring structure; forming a via which exposes the lower level wiring structure; forming a wiring trench above the via; filling the via with cobalt and lining wiring trench with the cobalt; and filling the wiring trench, on the cobalt lining, with conductive material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a cobalt plated via integration scheme and methods of manufacture. More specifically, the present disclosure is directed to a partial or full cobalt plating via integration scheme in a dual damascene structure. Advantageously, the present disclosure provides improved (reduces) electromigration (EM) failure in back-end-of-line (BEOL) technologies, as an example.

In embodiments, the present disclosure provides a dual damascene structure lined with cobalt (Co) along its sidewalls, with Co partially or fully filling the via with or without a barrier liner. It should be understood that the present disclosure, though, is not limited to dual damascene structures and, as such, is equally applicable to vias and wiring lines fabricated using single damascene processes. In embodiments, the Co plating can be provided prior to copper (Cu) plating to form a Co via with a Cu wiring structure above the Co via. Further, the Co can be used to line both the wiring structure and the via of the dual damascene structure. The embodiments disclosed herein can also include different integration schemes including, e.g., partially or fully filled Co vias, each with or without a barrier liner or any combinations thereof on a same chip. By providing the Co vias, early EM induced failure can be significantly reduced.

The cobalt plating scheme of the present disclosure can be manufactured in a number of ways using a number of different tools. In general, though, the methodologies and tools are used to form structures with dimensions in the micrometer and nanometer scale. The methodologies, i.e., technologies, employed to manufacture the cobalt plating scheme of the present disclosure have been adopted from integrated circuit (IC) technology. For example, the structures are built on wafers and are realized in films of material patterned by photolithographic processes on the top of a wafer. In particular, the fabrication of the cobalt plating scheme uses three basic building blocks: (i) deposition of thin films of material on a substrate, (ii) applying a patterned mask on top of the films by photolithographic imaging, and (iii) etching the films selectively to the mask.

Figure 1:
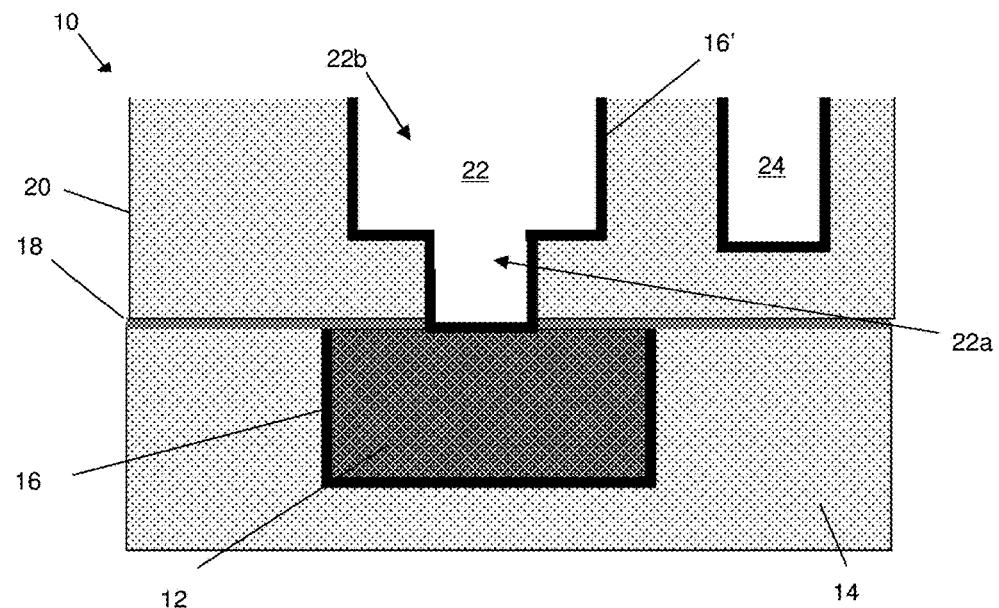
FIG. 1 shows a wiring structure and dual damascene structure, amongst other features, and respective fabrication processes in accordance with aspects of the present disclosure.

FIG. 1 shows a wiring structure and dual damascene structure, amongst other features, and respective fabrication processes in accordance with aspects of the present disclosure. More particularly, FIG. 1 shows a structure 10 with a lower level wiring structure 12 formed in a dielectric material 14. In embodiments, the lower level wiring structure 12 can be a copper wiring structure composed with a barrier liner 16. The barrier liner 16 can be any combination of, e.g., TiN, TaN, Ta and Ti; whereas, the conductive material for the metal wiring structure 12 can be copper, for example, deposited by a conventional chemical vapor deposition (CVD) process. The barrier liner 16 can be deposited by a plasma enhanced CVD (PECVD) process or low pressure chemical vapor deposition (LPCVD) process, as examples. The dielectric material 14 can be a low-k (oxide) or ultra-low-k interlevel dielectric material, as examples.

In more specific embodiments, the wiring structure 12 can be formed by conventional lithography, etching and deposition methods known to those of skill in the art. For example, a resist formed over the insulator material, e.g., dielectric material 14, is exposed to energy (light) to form a pattern (opening). An etching process with a selective chemistry, e.g., reactive ion etching (RIE), will be used to form one or more trenches in the dielectric material 14 through the openings of the resist. Following resist removal, the liner material 16 and conductive material 12 (e.g., metallization) can be deposited by any conventional deposition processes as described above. Any residual material on the surface of the dielectric material 14 can be removed by conventional chemical mechanical polishing (CMP) processes.

Still referring to FIG. 1, a capping material 18 is deposited over the surfaces of the wiring structure 12 and dielectric material 14. The capping material 18 can be a nitride material, as an example. In more specific embodiments, the capping material 18 can be SiN, SiNC or SiOC. An upper dielectric material 20 is deposited on the capping material 18. The upper dielectric material 20 can be any low-k or ultra-low-k dielectric material, as examples, deposited by, e.g., CVD.

A dual damascene structure 22 and a wiring trench 24 are formed in the upper dielectric material 20 using conventional lithography and etching processes as described herein. It should be understood by those of sill in the art that the dual damascene structure 22 can be fabricated using either dual or single damascene processes. In embodiments, the dual damascene structure is composed of a via 22a (which exposes a surface of the underlying wiring structure 12) and an upper wiring trench 22b (e.g., which is wider than the via 22a). The via 22a can be about 20 nm in width; although other dimensions are contemplated herein. The via 22a, wiring trench 22b and the wiring trench 24 can be lined with a barrier liner 16' (e.g., on sidewalls of the dielectric material 20 and in direct electrical contact with the wiring structure 12) using conventional blanket deposition processes, e.g., PECVD or LPCVD, to a depth of about 1-3 nm. The barrier liner 16' can be any combination of, e.g., TiN, TaN, Ta and Ti.

Figure 2:
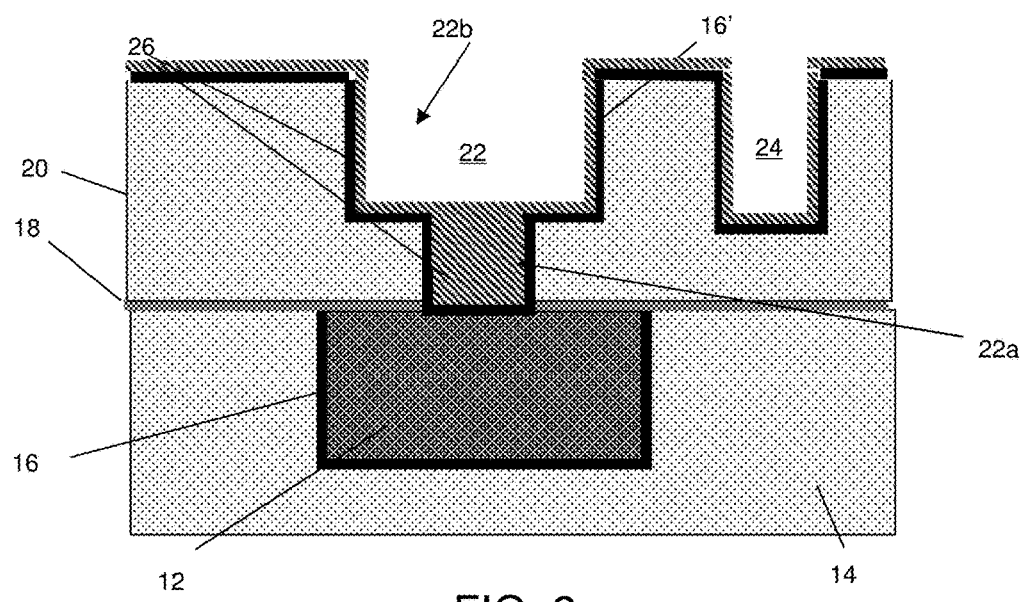
FIG. 2 show a via of the dual damascene structure completely filled with material, amongst other features, and respective fabrication processes in accordance with aspects of the present disclosure.

In FIG. 2, the via 22a, wiring trench 22b and the wiring trench 24 are lined with a cobalt material 26 in direct contact with the barrier liner 16'. In embodiments, the via 22a is also completely (fully) filled with the cobalt material 26 (compared to FIG. 4 which shows the via 22a partially filled with the cobalt material). The cobalt material 26 can be deposited by an atomic layer deposition (ALD) process (e.g., seed layer), followed by a plating process (e.g., electroplating processes) known to those of ordinary skill in the art. Advantageously, the deposition process of the cobalt material 26 is a bottom up plating process which provides improved flow capabilities (compared to copper fill processes), thereby eliminating or avoiding void formation within the via 22a that may otherwise result from a pinch-off phenomenon.

In embodiments, the cobalt material 26 will also form a sidewall liner on the sidewalls of the wiring trench 22b and the wiring trench 24 (over the barrier liner 16'). The sidewall liner, e.g., cobalt material 26, can be deposited to a depth of about 1 nm to about 3 nm directly on the barrier liner 16'; although other depths are also contemplated herein. For example, the liner can be at any depth that still allows the wiring trench 22b and the wiring trench 24 to be filled with conductive wiring material (e.g., copper) in subsequent processing steps. It should be understood that the cobalt material 26 (and barrier liner 16') will also be deposited on exposed surfaces of the upper dielectric material 20.

Figure 3:
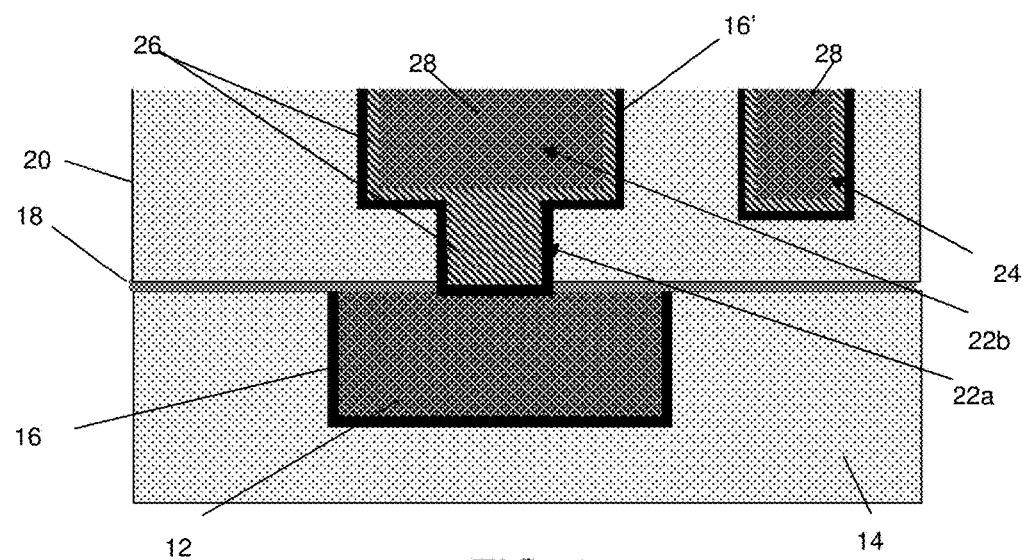
FIG. 3 show a wiring trench of the dual damascene structure filled with conductive wiring material, amongst other features, and respective fabrication processes in accordance with aspects of the present disclosure.

As shown in FIG. 3, conductive material 28 is deposited directly on the cobalt material 26 (e.g., sidewall liner and fully filled via 22a) in both the wiring trench 22b and the wiring trench 24. In embodiments, the conductive material 28 is a copper material which is deposited using conventional deposition methods, e.g., depositing a seed layer followed by an electroplating process. In this way, the via 22a is fully filled with cobalt (avoiding gap or void formation) with the wiring trenches 22b, 24 lined with the cobalt material 26 and fully filled with the conductive material 28. Any excess conductive material 28, residual cobalt material 26 and barrier liner material 16' on the upper surface of the dielectric material 20 can be removed by a conventional CMP process.

Figure 4:
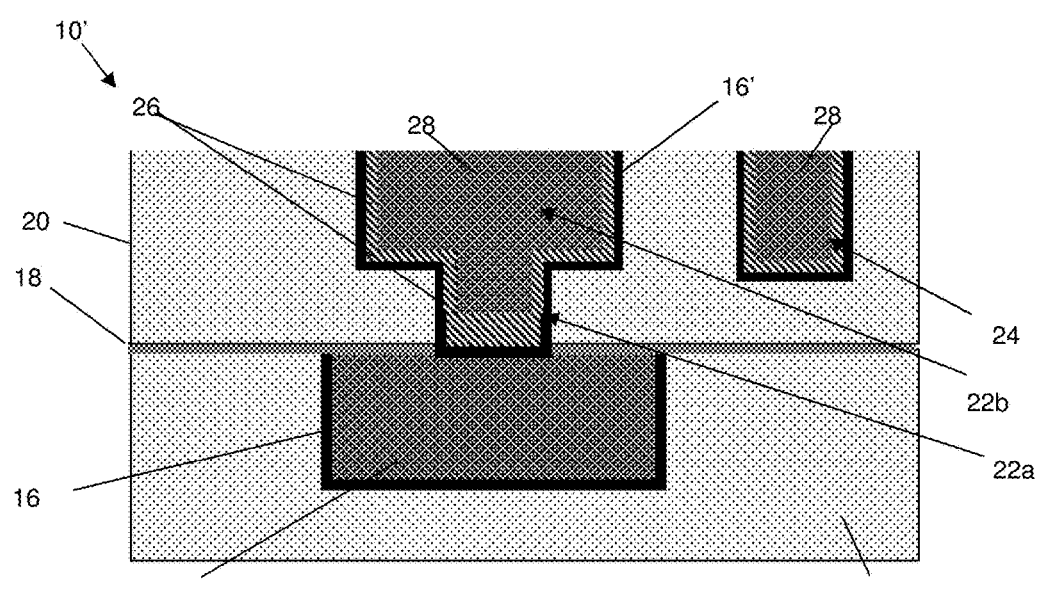
FIG. 4 shows the via of the dual damascene structure partially filled with material and conductive wiring material, amongst other features, and respective fabrication processes in accordance with additional aspects of the present disclosure.

FIG. 4 shows an alternative structure 10" with the via 22a partially filled with cobalt material 26. In embodiments, the height (partial fill) of the cobalt material 26 within the via 22a will depend on the dimensions (e.g., width and/or height) of the via 22a. More specifically, the cobalt material 26 will partially fill the via 22a to a height that will prevent void or gap formation of the subsequently deposited conductive material 28. The height of the material 26 that partially fills the via can also depend on the required electrical performance of the device. The remaining portion of the via 22a and the wiring trenches 22b, 24 will be filled with the conductive material, as already described herein. The remaining features shown in FIG. 4 are the same or substantially the same as shown and described with respect to FIG. 3.

Figure 5:
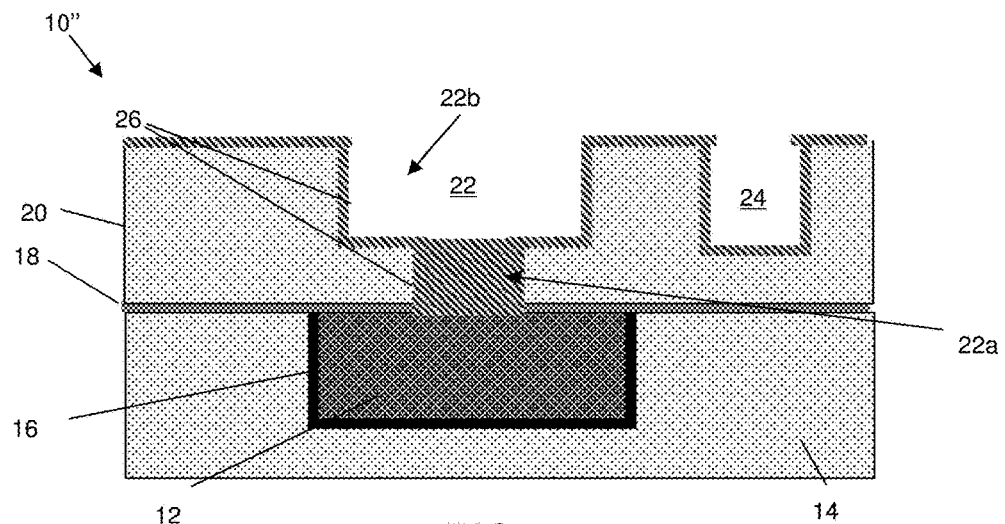
FIGS. 5 and 6 show the via of the dual damascene structure completely filled with material, prior to the deposition of a barrier liner, and respective fabrication processes in accordance with additional aspects of the present disclosure.
Figure 6:
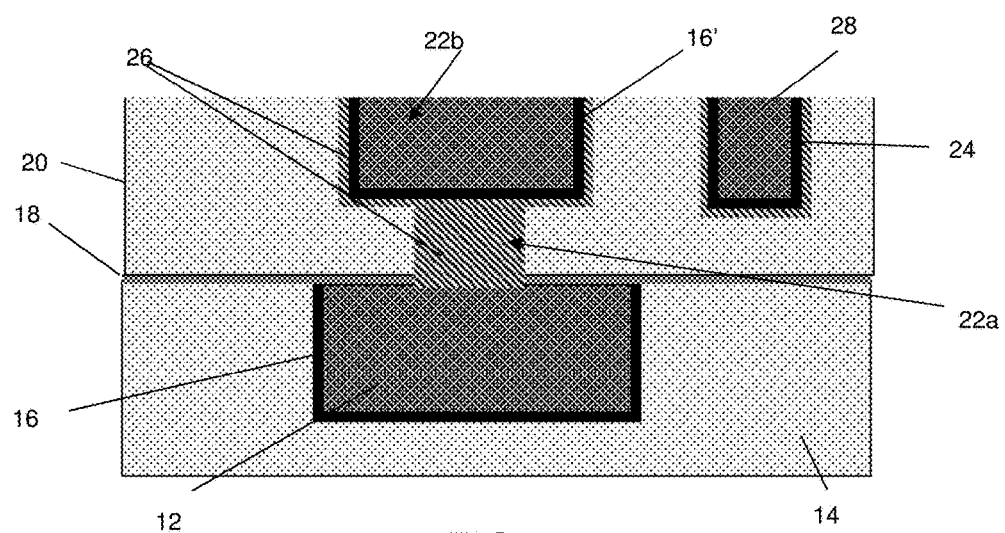

FIGS. 5 and 6 show the via 22a of the dual damascene structure fully filled with material 26, prior to application of a barrier layer. More specifically, the structure 10" shown in FIG. 5 includes the lower level wiring structure 12 with the barrier liner 16 formed in the dielectric material 14. The capping material 18 is formed on the surfaces of the wiring structure 12 and dielectric material 14. The dual damascene structure 22, e.g., via 22a and wiring trench 22b, and wiring trench 24 are formed in the upper dielectric material 20 using conventional lithography and etching processes, as described herein.

In embodiments, the dual damascene structure 22, e.g., via 22a and wiring trench 22b, and the wiring trench 24, are lined with a material, e.g., cobalt material 26. In embodiments, the via 22a is also completely filled with the cobalt material (compared to FIG. 7 which shows the via 22a partially filled with the cobalt material). In embodiments, the cobalt material is deposited in the via 22a by depositing a seed layer of the cobalt material 26 using an ALD process, followed by a plating process, e.g., electroplating process. The cobalt material 26 will also form a sidewall liner on the sidewalls of the wiring trench 22b and the wiring trench 24. The sidewall liner, e.g., cobalt material 26, can be deposited to a depth of about 1 nm to about 3 nm or other depths which allow the wiring trench 22b and the wiring trench 24 to be filled with conductive material in subsequent processing steps.

In FIG. 6, the barrier liner 16' is deposited directly on the cobalt material 26. The barrier liner 16' can be deposited by a conventional blanket deposition process, e.g., PECVD or LPCVD, to a depth of about 1-3 nm. The barrier liner 16' can be any combination of, e.g., TiN, TaN, Ta and Ti. Following the deposition of the barrier liner 16', conductive material 28 is deposited directly on the barrier liner 16', e.g., in the wiring trench 22b and the wiring trench 24 over the cobalt material 26. In embodiments, the conductive material 28 is a copper material which is deposited using conventional deposition methods, e.g., a seed layer followed by an electroplating process. Any excess conductive material 28, residual cobalt material 26 and barrier liner material 16' on the upper surface of the dielectric material 20 can be removed by a conventional CMP process. The resultant structure is a dual damascene structure comprising a via 22a fully filled with cobalt material 26, and wiring trenches 22b, 24 lined with cobalt material 26 and filled with the conductive material 28.

Figure 7:
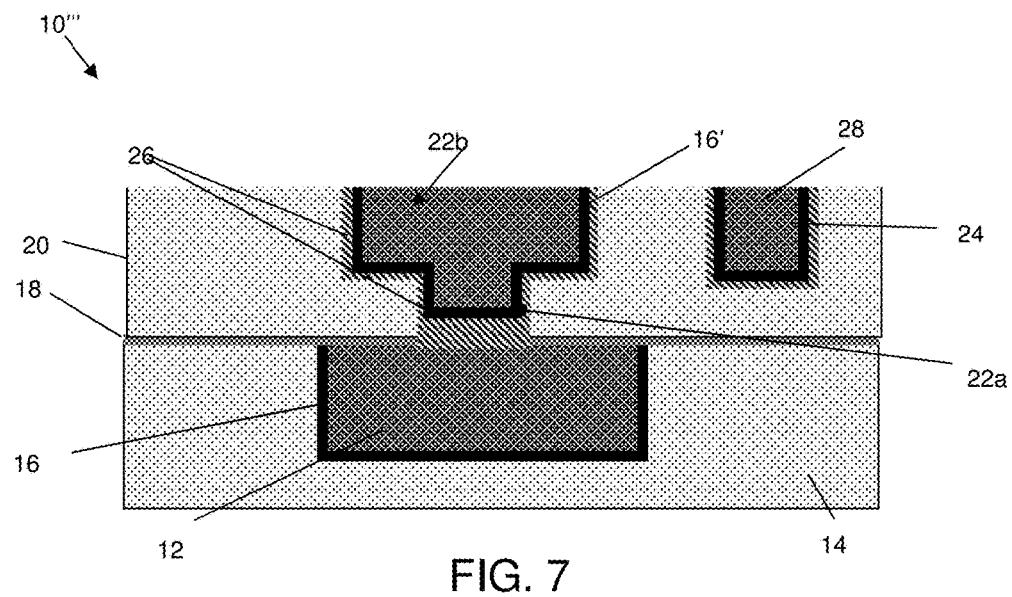
FIG. 7 shows the via of the dual damascene structure partially filled with material, prior to deposition of the barrier liner, and respective fabrication processes in accordance with additional aspects of the present disclosure.

FIG. 7 shows a structure 10''' with the via 22a of the dual damascene structure 22 partially filled with cobalt material 26, prior to application of a barrier layer. More specifically, and similar to that described with respect to FIG. 4, the cobalt material 26 will partially fill the via 22a to a height that will avoid void formation of the subsequently deposited conductive material 28. The height of the material 26 that partially fills the via 22a can also depend on the required electrical performance of the device. The remaining portion of the via 22a and the wiring trenches 22b, 24 will be lined with the barrier liner 16' and filled with the conductive material 28, as already described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a via structure composed of cobalt; and
    a wiring structure above the via structure, the wiring structure lined on its sidewalls with a barrier liner and the cobalt and further composed of conductive material over the cobalt and the barrier liner, the conductive material being different material than the cobalt, wherein the barrier liner is above the cobalt such that the barrier liner separates the cobalt from the conductive material in both the wiring structure and the via structure.

2. The structure of claim 1, wherein the via structure is fully composed of the cobalt and the barrier liner is above the via structure.

3. The structure of claim 1, wherein the via structure is partially composed of the cobalt with a remaining portion of the via structure composed of the conductive material and the barrier liner.

4. The structure of claim 1, wherein the via structure is fully composed of the cobalt, the cobalt is a liner of the wiring structure, and the barrier liner is on an upper surface of the cobalt of the via structure and on the cobalt liner of the wiring structure.

5. The structure of claim 1, wherein the via structure is partially composed of the cobalt, the cobalt is a liner of the wiring structure, and the barrier liner is partially in the via structure and on a surface of the cobalt in the wiring structure.

6. The structure of claim 5, wherein the conductive material is copper and is located over the barrier liner in the via structure and the wiring structure.

7. A structure comprising:
    a lower level wiring structure;
    a via structure in electrical contact with the lower level wiring structure, the via structure composed of cobalt; and
    an upper level wiring structure in electrical contact with the via structure, the wiring level wiring structure lined with at least the cobalt on its sidewalls, a barrier layer on the cobalt and extending over the via structure, and filled with conductive material which is different than the cobalt.

8. The structure of claim 7, wherein the via structure is fully filled with the cobalt.

9. The structure of claim 7, wherein the via structure is partially composed of the cobalt and the conductive material fills a remaining portion of the via structure.

10. The structure of claim 7, wherein the via structure is fully composed of the cobalt, the cobalt is a liner of the upper wiring structure, and the barrier liner is on an upper surface of the cobalt in the via structure and on the cobalt liner of the upper wiring structure.

11. The structure of claim 7, wherein the via structure is partially composed of the cobalt, the cobalt is a liner of the upper wiring structure, and the barrier liner is partially in the via structure and on a surface of the cobalt in the upper wiring structure.

12. A method comprising:
    forming a lower level wiring structure;
    forming a via which exposes the lower level wiring structure;
    forming a wiring trench above the via;

filling the via with cobalt and lining sidewalls of the wiring trench with the cobalt in a same deposition process;

lining the cobalt with a barrier liner such that the barrier liner separates the cobalt from conductive material in both the wiring structure and the via structure, the barrier liner also extending over the via to separate the cobalt in the via and the conductive material in the wiring trench; and filling the wiring trench, over the cobalt lining, with the conductive material which is different than the cobalt.

13. The method of claim 12, wherein the cobalt partially fills the via and the conductive material fills a remaining portion of the via and the wiring trench.

* * * * *